(12) United States Patent
Kim et al.

(10) Patent No.: US 7,599,219 B2
(45) Date of Patent: *Oct. 6, 2009

(54) FLASH MEMORY DEVICES THAT SUPPORT INCREMENTAL STEP-PULSE PROGRAMMING USING NONUNIFORM VERIFY TIME INTERVALS

(75) Inventors: Soo-Han Kim, Seoul (KR); Jae-Yong Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/031,422

(22) Filed: Feb. 14, 2008

(65) Prior Publication Data

US 2008/0137435 A1 Jun. 12, 2008

Related U.S. Application Data

(63) Continuation of application No. 11/381,140, filed on May 2, 2006, now Pat. No. 7,349,263.

(30) Foreign Application Priority Data

Jun. 27, 2005  (KR) ............................... 2005-55906

(51) Int. Cl.
*G11C 11/34* (2006.01)
(52) U.S. Cl. .............................. 365/185.19; 365/185.22
(58) Field of Classification Search ............ 365/185.02, 365/185.22, 185.17, 185.03, 185.18, 185.19
See application file for complete search history.

(56) References Cited

U.S. PATENT DOCUMENTS 6,522,580 B2 * 2/2003 Chen et al. ............. 365/185.02

(Continued)

FOREIGN PATENT DOCUMENTS

JP 11-031391 2/1999

(Continued)

OTHER PUBLICATIONS

Notice to File a Response/Amendment to the Examination Report, Korean Application No. 10-2005-00559076, Aug. 14, 2006.

*Primary Examiner*—Hoai V Ho
*Assistant Examiner*—Jason Lappas
(74) *Attorney, Agent, or Firm*—Myers Bigel Sibley & Sajovec

(57) ABSTRACT

Nonvolatile memory devices support programming and verify operations that improve threshold-voltage distribution within programmed memory cells. This improvement is achieved by reducing a magnitude of the programming voltage steps and increasing a duration of the verify operations once at least one of the plurality of memory cells undergoing programming has been verified as a "passed" memory cell. The nonvolatile memory device includes an array of nonvolatile memory cells and a control circuit, which is electrically coupled to the array of nonvolatile memory cells. The control circuit is configured to perform a plurality of memory programming operations (P) by driving a selected word line in the array with a first stair step sequence of program voltages having first step height (e.g., $\Delta V1$) and then, in response to verifying that at least one of the memory cells coupled to the selected word line is a passed memory cell, driving the selected word line with a second stair step sequence of program voltages having a second step height (e.g., $\Delta V2$) lower than the first step height.

12 Claims, 9 Drawing Sheets

U.S. PATENT DOCUMENTS

| | | |
|---|---|---|
| 6,768,682 B2 | 7/2004 | Yano et al. |
| 7,200,043 B2 * | 4/2007 | Chen ..................... 365/185.22 |
| 7,349,263 B2 * | 3/2008 | Kim et al. .............. 365/185.19 |
| 2004/0130943 A1 | 7/2004 | Hirano et al. |
| 2005/0057997 A1 * | 3/2005 | Mitani et al. ................ 365/222 |
| 2005/0157565 A1 * | 7/2005 | Lee ....................... 365/189.05 |

FOREIGN PATENT DOCUMENTS

| | | |
|---|---|---|
| JP | 2003-173688 | 6/2003 |
| JP | 2005-092948 | 4/2005 |
| KR | 10-2004-0073744 A | 3/2005 |

* cited by examiner

FLASH MEMORY DEVICES THAT SUPPORT INCREMENTAL STEP-PULSE PROGRAMMING USING NONUNIFORM VERIFY TIME INTERVALS

CROSS-REFERENCE TO RELATED APPLICATION

This application is a continuation of U.S. application Ser. No. 11/381,140, filed May 2, 2006, now U.S. Pat. No. 7,349,263 which claims priority to Korean Application 2005-55906, filed on Jun. 27, 2005. The disclosure of U.S. application Ser. No. 11/381,140 is hereby incorporated herein by reference.

FIELD OF THE INVENTION

The present invention relates to integrated circuit memory devices and, more particularly, to flash memory devices and methods of operating flash memory devices

BACKGROUND OF THE INVENTION

Flash memory devices are a type of nonvolatile semiconductor memory device. Flash memory devices are regarded as being highly adaptable to large storage capacities and high-frequency operation in applications requiring large-capacity storage devices and coded memories for mobile apparatuses. Flash memory devices are generally classified into NAND and NOR types by the logical pattern of the cell array. The memory cell array of the NOR-type flash memory device is structured such that a plurality of memory cells is arranged as being connected to a single bitline in parallel. In contrast, the NAND-type flash memory device has a memory cell array in which a plurality of memory cells are connected in series from a single bitline. The NOR-type flash memory devices are widely used in applications requiring high-frequency operations because they are operable with high speed in programming and reading operations, relative to the NAND-type flash memory devices. Data values within the flash memory device are defined by the threshold voltages of the memory cells, in which programming operations are carried out by changing the cell threshold voltages. It is now conventional to regulate the cell threshold voltages by the ISPP scheme during programming operations.

FIG. 1 illustrates the pulses of programming and verifying voltages applied to a wordline of a memory cell during a programming operation with the ISPP scheme in a general flash memory. As shown in FIG. 1, in a typical cycle of the ISPP scheme, a unit step of incrementing a program voltage is confined to a $\Delta V$ value and a unit verifying time is fixed to $\Delta t$. Such fixed ranges for the program voltage step and the unit verifying time are contrary to achieving narrow distribution profiles of cell threshold voltages in multi-level cell (MLC) arrangements. In detail, the fixed range of the incremental program voltage step raises the probability of shifting cell threshold-voltage distribution profiles upward from a verifying voltage Vveri, after the programming operation for those memory cells that have threshold voltages near to the verifying voltage Vveri. This effect arises when the incremental step of the program voltage is excessively high to inject the appropriate amount of hot electrons into a floating gate. The threshold-voltage distribution profiles of memory cells can be improved as the program voltage step becomes lower. However, a too low level of the program voltage step causes the threshold voltages to be reduced in shifting width so much and the number of programming loops to increase thereby, resulting in a longer overall programming time. While a reduction of the program voltage step is effective in improving the threshold-voltage distribution profiles of memory cells, it is inevitable that this method causes a loss in operating speed. To the contrary, an increase in the program voltage step would incur a heavy loss against the threshold-voltage distribution profiles, but it accelerates a programming speed.

The problems due to the fixed verifying time are generated when the threshold voltages of memory cells are close in value to the verifying voltage Vveri. In general, sense amplifiers employed in the flash memory devices detect and amplify drain voltages discharged while the verifying voltage is being applied to wordline. If a threshold voltage of memory cell is higher than the verifying voltage Vveri, the memory cell is detected as an off-cell. However, if a threshold voltage of a memory cell is lower than the verifying voltage Vveri, the memory cell is detected as an on-cell. However, when there is only a small difference between a cell threshold voltage and the verifying voltage, (i.e., when the threshold voltage is positioned around an intermediate level between the on-cell and off-cell) a sensing time interval may need to become substantial to obtain accurate verification of the program state of a cell. If a memory cell undergoes an insufficiently long verification operation, then it may be judged as a passed cell even though its threshold voltage is at a relatively low "fail" level. As will be understood by those skilled in the art, the use of a verification operation having an insufficiently long verification time interval may cause "failed" cells to appear as "passed" cells and thereby increase a width of a threshold-voltage distribution profile.

SUMMARY OF THE INVENTION

Nonvolatile memory devices according to embodiments of the present invention support programming and verify operations that improve threshold-voltage distribution within programmed memory cells. This improvement is achieved by reducing a magnitude of the programming voltage steps and increasing a duration of the verify operations once at least one of the plurality of memory cells undergoing programming has been verified as a "passed" memory cell. According to some of these embodiments, the nonvolatile memory device includes an array of nonvolatile memory cells and a control circuit, which is electrically coupled to the array of nonvolatile memory cells. The control circuit, which may include a plurality of functional circuit elements, is configured to perform a plurality of memory programming operations (P) by driving a selected word line in the array with a first stair step sequence of program voltages having first step height (e.g., $\Delta V1$) and then, in response to verifying that at least one of the memory cells coupled to the selected word line is a passed memory cell, driving the selected word line with a second stair step sequence of program voltages having a second step height (e.g., $\Delta V2$) lower than the first step height. The control circuit may also be configured to perform a plurality of memory verify operations (V), which are interleaved in time with the plurality of memory programming operations.

According to aspects of these embodiments, a first plurality of memory verify operations are associated with the first stair step sequence of program voltages and a second plurality of memory verify operations are associated with the second stair step sequence of program voltages. In order to support a narrowing of the threshold-voltage distribution within the programmed memory cells, a first duration (t1) of the first plurality of memory verify operations is less than a second duration (t2) of the second plurality of memory verify operations. Moreover, a first interleaved sequence of program and verify operations associated with the first stair step sequence of program voltages commences with a program operation and terminates with a verify operation having the first duration (t1) and a second interleaved sequence of program and verify operations associated with the second stair step sequence of program voltages commences with a verify operation having the second duration (t2). Thus, two immediately consecutive verify operations of different duration are performed during an interval when at least one memory cell is verified as a passed memory cell.

The control circuit according to embodiments of the invention may include a row decoder electrically coupled to a plurality of word lines in the array and a voltage generator electrically coupled to the row decoder. The voltage generator is responsive to a voltage control signal (V_CONT). A program controller is also provided within the control circuit. The program controller is configured to switch the voltage control signal (V_CONT) from a first logic state to a second logic state in response to a first pass signal (e.g., SPF) and is further configured to switch the voltage control signal from the second logic state to the first logic state in response to a last pass signal (e.g., MPF). This control circuit also includes a sense amplifier and a pass/fail detector electrically coupled to an output of the sense amplifier. The pass/fail detector is configured to generate the first and last pass signals and the sense amplifier is responsive to a sense amplifier enable signal generated by the program controller. In particular, the pass/fail detector may include a first pass detector having OR logic therein that generates the first pass signal SPF and a last pass detector having AND logic therein that generates the last pass signal MPF.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
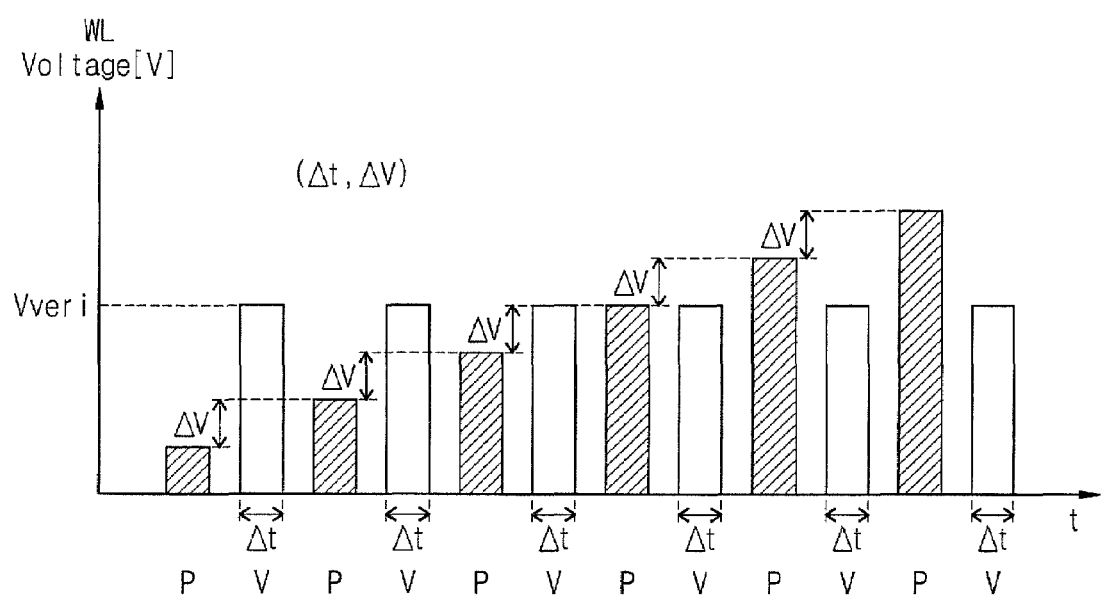
FIG. 1 is a diagram showing variations of voltage levels versus time during programming and verifying operations by an ISPP scheme in a conventional flash memory device.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 2:
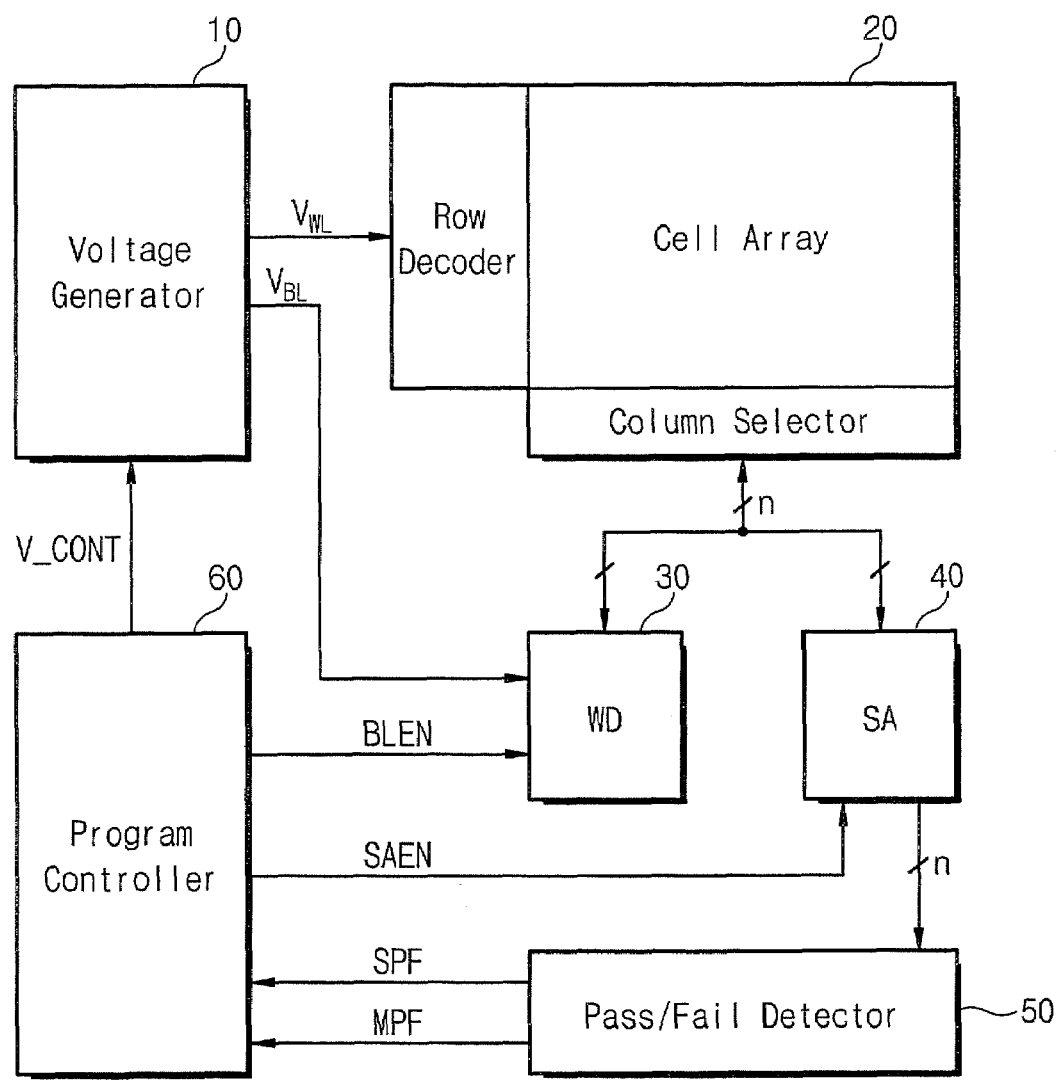
FIG. 2 is a block diagram illustrating a memory device that performs programming and verifies operations according to embodiments of the present invention.

FIG. 2 is a block diagram illustrating a functional structure for a programming operation in a flash memory according to an embodiment of the present invention. The flash memory device includes a memory cell array 20 coupled to a row decoder and a column selector, a voltage generator 10 supplying a program voltage Vpgm and a verifying voltage Vveri to a wordline of memory cells, a writing driver 30 setting bitline voltages of memory cell to be programmed in a programming operation, a sense amplifier 40 detecting channel currents of memory cells in verifying steps, a pass/fail detector 50 checking up pass states with at least one memory cell and with all the memory cells, and a program controller 60 regulating the program voltage and sensing time therein. With such an organization, the programming operation is carried out using a first mode that repeats a cycle with a larger incremental step range $\Delta V1$ and a shorter verifying time t1, and a second mode that repeats a cycle with a smaller incremental step range $\Delta V2$ and a longer verifying time t2. These functional elements that are shown in FIG. 2 as being coupled (directly or indirectly) to the cell array 20 collectively define a memory content circuit.

The voltage generator 10 generates voltages for the programming and verifying operations (e.g., $V_{WL}$, $V_{BL}$, and so forth), which are supplied to the wordline and the writing driver 30. The voltage $V_{WL}$ applied to a wordline includes the program voltage Vpgm, which is applied to a wordline while programming memory cells, and the verifying voltage Vveri that is applied to a wordline while verifying memory cells. The voltages used for programming the flash memory device are applied to wordlines in the ISPP scheme so as to shift up threshold voltages of memory cells over the verifying voltage Vveri. The ISPP scheme is conducted by repeating a loop in which stepping-up program-voltage pulses of Vpgm are applied to the wordline and then the verifying voltage Vveri is applied next thereto. The voltage generator 10 is designed to supply program-voltage pulses to wordlines in variable stepping-up ranges, which differs from the uniform ranges shown in FIG. 1. Further, the bitline voltage $V_{BL}$ for activating a selected bitline during the programming operation is also generated in sync with the program voltage Vpgm.

The memory cell array 20 includes a plurality of memory cells arranged in a NOR logical pattern, being connected with the row and column devices. The memory cells described herein are referred as being operable with the characteristics of NOR-type flash memory cells.

The writing driver block 30 activates bitlines of selected memory cells at a point of applying the program voltage Vpgm to a wordline of the selected memory cell. During the programming operation, the writing driver block 30 transfers the bitline voltage VBL to the bitlines from the voltage generator 10 in response to a bitline-enabling signal BLEN provided from the program controller 60. While applying the program voltage Vpgm to the wordline, the writing driver block 30 controls a drain side of the selected memory cell on a level of the bitline voltage $V_{BL}$ (e.g., 5V) so as to induce the injection of hot electrons into a floating gate electrode of the memory cell.

The sense amplifier block 40 is connected to both the writing driver block 30 and the bitlines of memory cells, detecting cell states during reading and verifying operations. The sense amplifier block 40 includes a plurality of sense amplifiers, which are coupled to corresponding bitlines in the cell array 20. During the reading operation, a read voltage Vread is applied to a selected wordline of memory cells and the sense amplifiers of the block 40 detect data in accordance with pass or fail states of the memory cells. In the verifying operation, the verifying voltage is applied to a selected wordline and the sense amplifiers of the block 40 detect pass or fail states of the memory cells in response to a sense-enabling signal SAEN. The verifying time is controlled in response to the sense-enabling signal SAEN that is applied to the sense amplifier block 40 from the program controller 60.

The pass/fail detector 50 outputs first and last pass signals, SPF and MPF, in response to monitoring detection results of the sense amplifier block 40. In a general case, a pass signal is generated to the program controller 60 only when all memory cells are detected as being in pass states even if there are inputs of pass-informing signals or data from sense amplifiers. In contrast, the flash memory device of the present invention includes circuitry for detecting a point at which at least one memory cell has been verified as being passed. When this occurs, the first pass signal SPF goes to a high level and the program controller 60 identifies that there is one or more memory cell passed in the ISPP loop. The last pass signal MPF goes to high level only when all the memory cells, which have been programmed, are detected as being passed by the sense amplifiers. The structures and operations of the pass/fail detector 50 will be further described in detail with reference to FIG. 3.

The program controller 60 monitors and regulates conditions of the programming voltages and detecting operations with the aforementioned components. The program controller 60 regulates the voltage generator 10 using a voltage control signal V_CONT. This regulation causes a transfer of the program voltage by the ISPP scheme with the larger incremental step range $\Delta V1$ to a selected wordline in the first programming mode. In addition, the program controller 60, while the program voltage Vpgm of pulse is being applied to the selected wordline, controls the writing driver block 30 to activate the bitline-enabling signal BLEN in sync with the pulses of the program voltage Vpgm. In a step of verifying a programmed result after applying the program voltage pulses Vpgm, the program controller 60 outputs the sense-enabling signal SAEN for the time t1, regulating a verifying time by the sense amplifier block 40. If there is a receipt of the first pass signal SPF, which goes to a high level when at least a memory cell is detected as being passed during the period of the first programming mode, the program controller 60 changes operation to the second programming mode that is characterized with the smaller incremental step range $\Delta V2$ and the longer verifying time t2.

Here, in the second programming mode, it is required that a verifying operation occur over a longer verifying time t2 that supports accurate detection of whether the corresponding memory cells are being in the pass states, for memory cells detected as being passed during the first programming mode. Thus, when the first pass signal SPF goes to a high level, the program controller 60 activates the sense-enabling signal SAEN during the time t2 to conduct a re-verifying operation for the first passed cells, at the beginning of the second programming mode. After this re-verify operation, in a step of applying the program voltage pulse Vpgm, the voltage generator 10 is controlled to supply the program voltage Vpgm with the smaller incremental step range $\Delta V2$ to the selected wordline. The second programming mode is terminated when all of the memory cells are detected as being completely programmed after the generation of the first passed cells. After completing the programming operation for all of the memory cells to be programmed, the pass/fail detector 50 detects the completion of the programming operation and sends the last pass signal MPF to the program controller 60. The program controller 60 terminates the program operation cycle in response to the last pass signal MPF. The program controller may be comprised of a timer to output an alternative one of the first and second verifying times.

As such, the programming operation is carried out by way of the first programming mode with repeated high-frequency programming/verifying loops and the second programming mode with repeated high-resolution programming/verifying loops, using the functional components shown in FIG. 2. The second programming mode begins in response to detecting at least one passed memory cell by the first programming mode. While the first programming mode is terminated with the verifying operation, the second programming mode begins with resuming the verifying operation that is carried out in the larger verifying time so as to correctly check out whether the memory cells are conditioned in the pass states. The reason for conducting the verifying operation of the second programming mode subsequent to the verifying operation at the end of the first programming mode will be described in detail with reference to FIG. 5.

Figure 3:
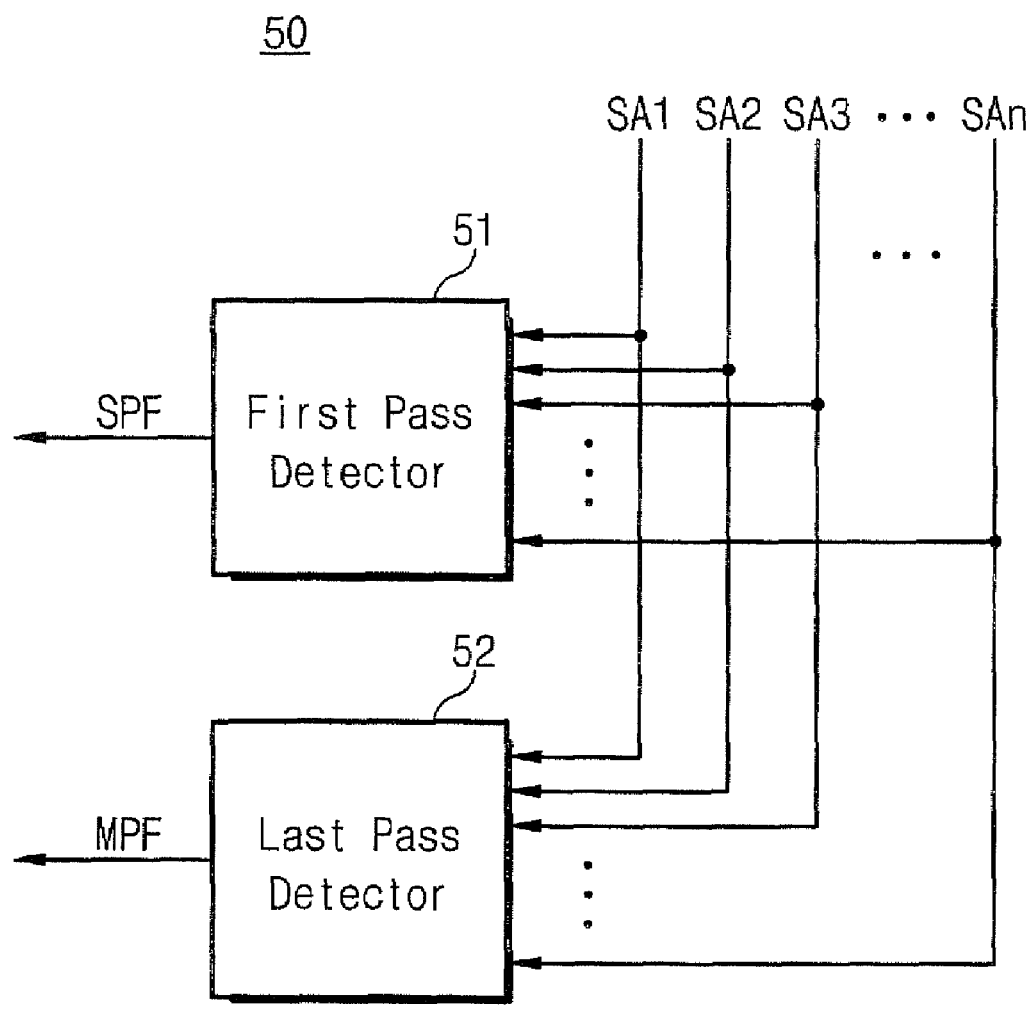
FIG. 3 is a block diagram illustrating a functional structure of a pass/fail detector shown in FIG. 2.

FIG. 3 is a block diagram illustrating a functional structure of the pass/fail detector 50 shown in FIG. 2. Referring to FIG. 3, the pass/fail detector 50 is comprised of first and last pass detectors, 51 and 52, inputting cell detection results from the sense amplifiers of the block 40. The first pass detector 51 generates and supplies the first pass signal SPF to the program controller 60 when there is at least one memory cell detected as being passed. For instance, if the pass state corresponds to when an output of the sense amplifier block 40 is logically '1', the first pass detector 51 has the same input/output characteristics as an OR logic gate. If there is detected at least a single passed memory cell (i.e., at least one of the lines SA1, SA2, . . . SAn is a logical "1"), the first pass signal SPF goes to high level and is transferred to the program controller 60.

The last pass detector 52 generates and applies the last pass signal MPF to the program controller 60 when all of the memory cells are detected as being passed. The last pass detector 52 may be formed of an AND logic gate, outputting the last pass signal MPF at a high level only when all the memory cells are detected as being passed and outputs of the sense amplifiers are all logically "1". If all the memory cells are completely programmed and all the sense amplifier output signals indicate the pass states, the last pass signal MPF will go to a high level and be transferred to the program controller 60.

Thus, the pass/fail detector 50 provides circuitry for switching the operation to the second programming mode in response to generating the first pass signal SPF and terminating the whole programming operation in response to generating the last pass signal MPF.

Figure 4:
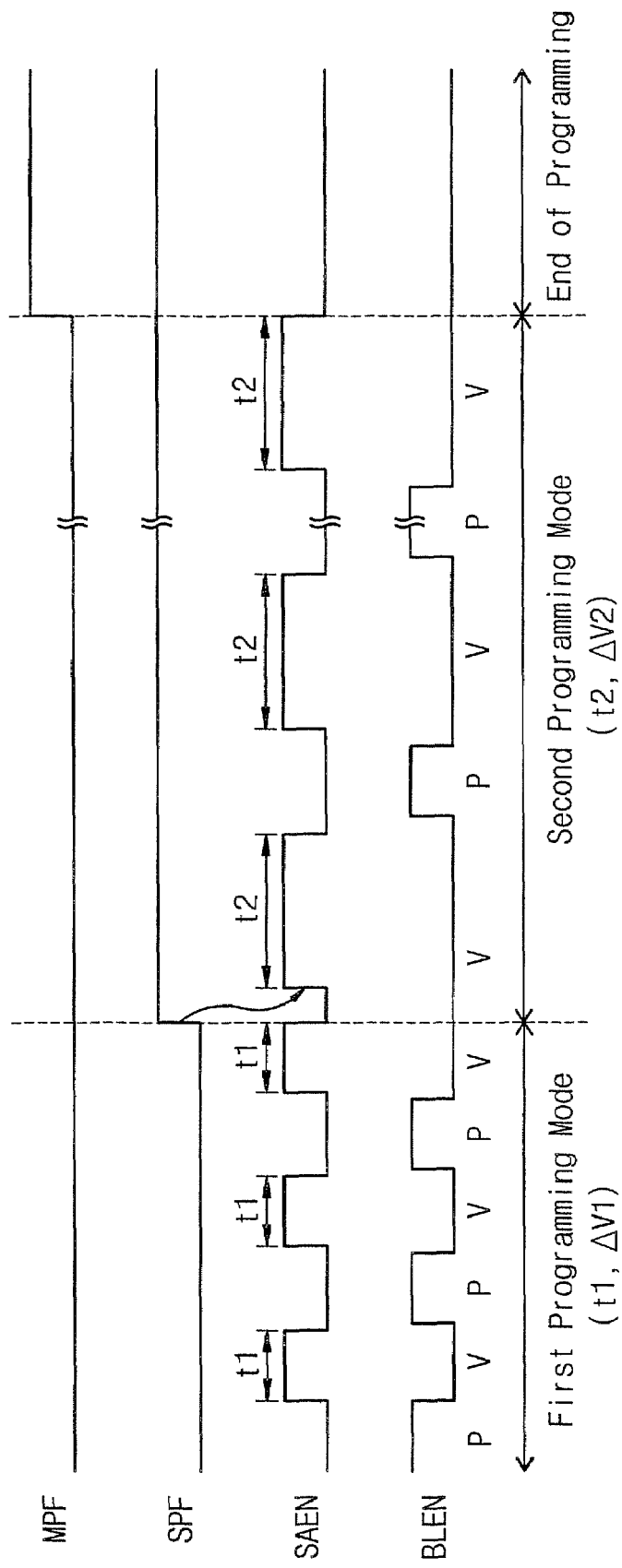
FIG. 4 is a timing diagram illustrating sensing operations performed by the memory device of FIG. 2.

FIG. 4 is a timing diagram illustrating the sensing operation by means of the components shown in FIG. 2, which are regulated by the program controller 60. Referring to FIG. 4, a turning point between the first and second programming modes is a point when the first pass signal SPF rises up to high level. In the first programming mode, it can be seen that the turning point corresponds to the time period t1 for which the sense-enabling signal SAEN is set to a high level to activate the sense amplifier block 40. In this description, the high-level period of the sense-enabling signal SAEN is also referred to as a verifying time for detecting a pass state of a memory cell by the sense amplifier. The bitline-enabling signal BLEN is logically the reverse to the sense-enabling signal SAEN. When the bitline-enabling signal BLEN is set to a high level, it is the programming period for which the program voltage pulse Vpgm is being applied to a selected wordline. The incremental range of the program voltage in the first programming mode is the larger incremental step range $\Delta V1$. When it detects a first passed cell while the first programming mode is being conducted with programming and verifying cycles by the ISPP scheme, the first pass signal SPF goes to a high level to turn the operation into the second programming mode. As aforementioned with reference to FIG. 2, the second programming mode begins with the operation for correctly detecting the first passed cells. In other words, the second programming mode begins with the verifying operation for the longer verifying time t2 that permits precise verification for the already passed memory cells, and does not begin immediately with a programming operation subsequent to the last verifying time t1 of the first programming mode. Such subsequent verifying operations over the first and second programming modes are provided to prevent miss-detection of a programmed memory cell due to an insufficient verifying time although the programmed memory cell has a threshold voltage lower than the verifying voltage Vveri. Namely, subsequent to the verifying operation of the first programming mode, the second programming mode verifies the first passed cells in the longer verifying time t2 that is sufficiently extended more than the time t1. If the first passed cell is detected as a failed one through the verifying operation at the beginning of the second programming mode, the memory cell will be excluded from the next programming operation. For this, the second programming mode begins with a verifying operation. And, the second programming mode is terminated in response to the last pass signal MPF of high level by normal completion of program for all the memory cells.

As such, the program controller 60 enables the high-frequency (high-speed) programming operation in the first programming mode, and the second programming mode, after the generation of at least one first passed cells, with the smaller incremental step range $\Delta V2$ and the longer verifying time t2, in sequence. Therefore, embodiment of the present invention are able to effectively restrain the upper and lower distribution profiles of threshold voltages after completing the whole programming operation by means of the organization for adaptively changing the incremental range of the program voltage step and the verifying time in accordance with the generation of the first passed cells.

Figure 5A:
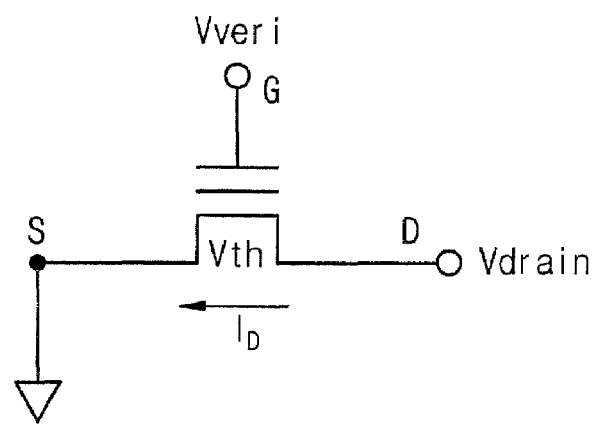
FIG. 5A is a circuit diagram illustrating a bias condition in a verifying operation for a NOR-type memory cell.
Figure 5B:
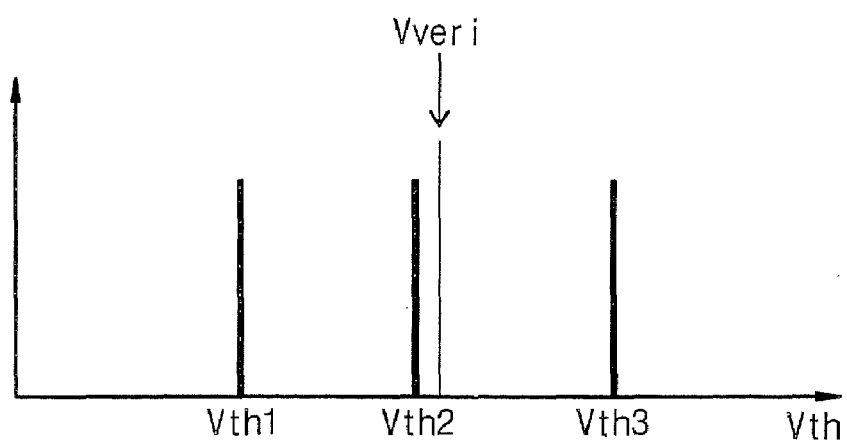
FIG. 5B is a diagram illustrating relative positions of threshold and verifying voltages for a unit memory cell.
Figure 5C:
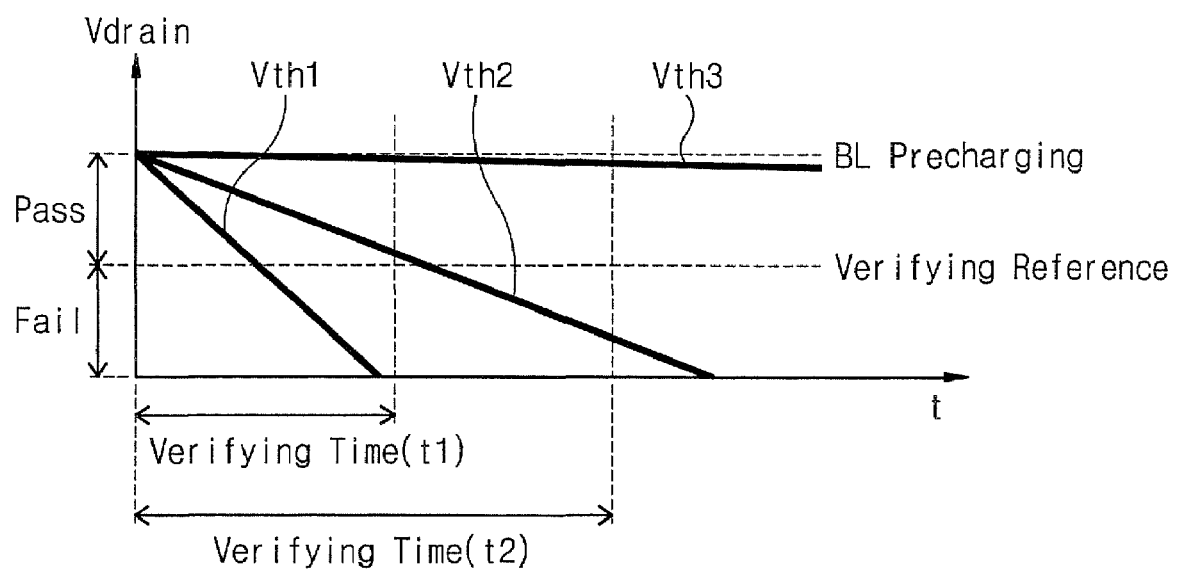
FIG. 5C is a graphic diagram illustrating features of verifying processes in accordance with variations of threshold voltages along the drain voltage and verifying time in memory cells.

FIGS. 5A, 5B, and 5C explain reasons for carrying out the verifying operation with the longer verifying time t2 at the beginning of the second programming mode after the detection (or generation) of the first passed cell (or cells) by the first programming mode as shown in FIG. 4. FIG. 5A is a circuit diagram illustrating a bias condition in the verifying operation for a NOR-type memory cell. Referring to FIG. 5A, in the NOR-type memory cell programmed in a predetermined threshold voltage Vth, the source electrode S is grounded to a reference voltage while the drain electrode D is precharged in a voltage Vdrain offered by the sense amplifier. The control gate G is supplied with the verifying voltage Vveri through the wordline thereof so as to find the pass state. The sense amplifier compares the drain voltage Vdrain with the reference voltage to detect whether the memory cell is being held in an "on" state or an "off" state in response to application of the verifying voltage Vveri.

Now, it will be described about the benefit of conducting the sequential verifying operations while switching from the first programming mode to the second programming mode. FIG. 5B is a diagram illustrating positions of threshold and verifying voltages for a unit memory cell. From FIG. 5B, it is possible to find the positions of a first threshold voltage Vth1 sufficiently lower than the verifying voltage Vveri, a second threshold voltage Vth2 lower than the verifying voltage Vveri but near thereto, and a third threshold voltage Vth3 sufficiently higher than the verifying voltage Vveri. The first and second threshold voltages, Vth1 and Vth2, which are lower than the verifying voltage Vveri, correspond to an on-state cell, while the third threshold voltage Vth3, which is higher than the verifying voltage Vveri, corresponds to an off-state cell.

FIG. 5C is a graphic diagram illustrating features of verifying processes in accordance with variations of threshold voltages (along the drain voltage) and verifying time in memory cells. Referring to FIG. 5C, in the case of the first and third threshold voltages Vth1 and Vth3 with sufficient intervals from the verifying voltage Vveri, it is possible to correctly detect a cell state regardless of the verifying time t1 or t2. But, in the case of the second threshold voltage Vth2, which is approximately equal to the verifying voltage Vveri, the cell state would be detected as passed if the short verifying time t1 was used or failed if the longer verifying time was used. This anomaly may result in miss-verification due to the insufficient verifying time although a cell threshold voltage is still lower than the verifying voltage Vveri. Since a memory cell once detected as being passed is excluded from the next programming cycle, it results in extension of the lower threshold-voltage distribution profile to a level below the verifying voltage Vveri.

Thus, embodiments of the invention include a first programming mode where the verifying operation is conducted in a shorter verifying time t1, and the second programming mode resumes the verifying operation for the passed cells in the longer verifying time t2.

Figure 6:
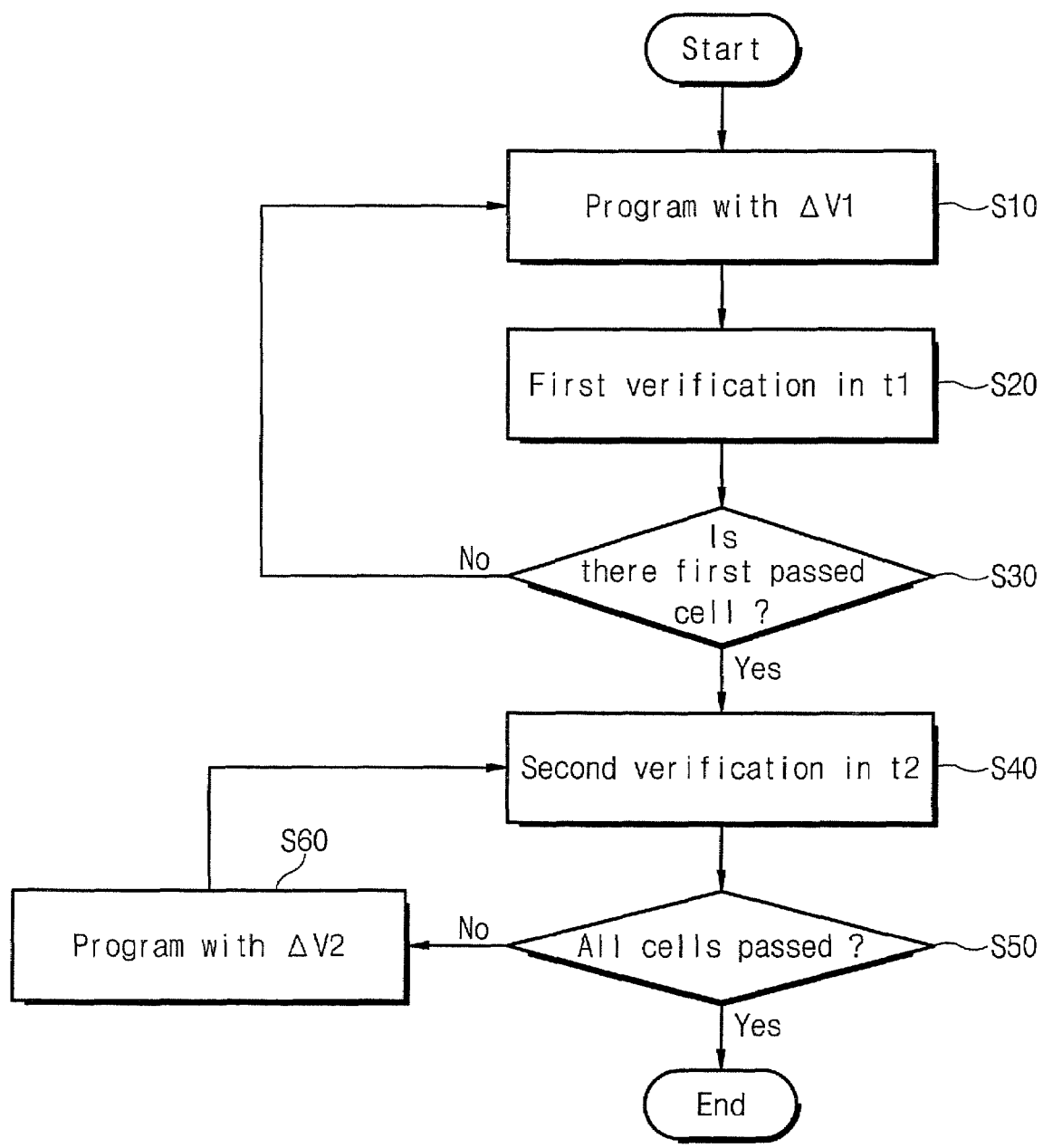
FIG. 6 is a flow chart illustrating programming operations performed by embodiments of the present invention.

FIG. 6 is a flow chart illustrating a programming procedure by an adaptive ISPP scheme in accordance with embodiments of the invention. During the beginning of the adaptive ISPP programming operation, the wordlines of the memory cells are supplied with the program voltage pulse with the larger incremental step range $\Delta V1$ (i.e., a first program voltage), in order to shift the threshold voltages up near to the verifying voltage (step S10), which is the first programming mode. Next, a first verifying step S20 is carried out for the shorter verifying time t1 (i.e., a first verifying time), after once applying the program voltage pulse. If there is no passed cell after the first verifying step, the procedure returns to the step S10 of programming with a voltage pulse in the larger incremental step range $\Delta V1$. However, if there is at least one passed cell after the first verifying step, then operations pass from step S30 to step S40 where the second programming mode begins.

The second programming mode initially verifies the first passed cells in the longer verifying time t2 that is sufficiently extended more than the time t1, S40. If the first passed cell is detected as a failed one through the verifying operation at the beginning of the second programming mode, the memory cell should not be excluded in the next programming operation.

The second programming mode begins with re-verifying the first passed cell with the second verifying time t2 (step S40). And, it continues to detect whether all the memory cells are being passed until the last pass signal MPF is applied to the program controller 60 shown FIG. 2 (step S50). If all the memory cells are detected as not being passed entirely, it repeats the steps of programming the memory cells in the program voltage pulse with the incremental step range ΔV2 smaller than ΔV1 used in the first programming mode (S60) and verifying the programmed memory cells in the second verifying time t2 (S40). The steps S40 through S60 are a programming and verifying loop that corresponds to the second programming mode. If there is an input of the last pass signal MPF at the program controller 60, indicating that all the memory cells are detected as being passed during the second programming mode, the whole programming procedure according to the adaptive ISPP scheme is terminated.

Accordingly, the adaptive ISPP scheme including the aforementioned steps is able to quickly shift threshold voltages of the memory cells close to the verifying voltage Vveri by means of the program voltage with the larger incremental step range ΔV1 and the shorter verifying time t1. Further, after the generation of the first passed cell, the second programming mode is carried out to accomplish the high-resolution programming result, responding to the first pass signal SPF, by means of the program voltage with the smaller incremental step range ΔV2 and the longer verifying time t2. Especially, the second programming mode is controlled to start, after detecting at least a passed cell through the first programming mode, with the verifying operation in the time t2 that extends longer than the former verifying time t1.

Figure 7:
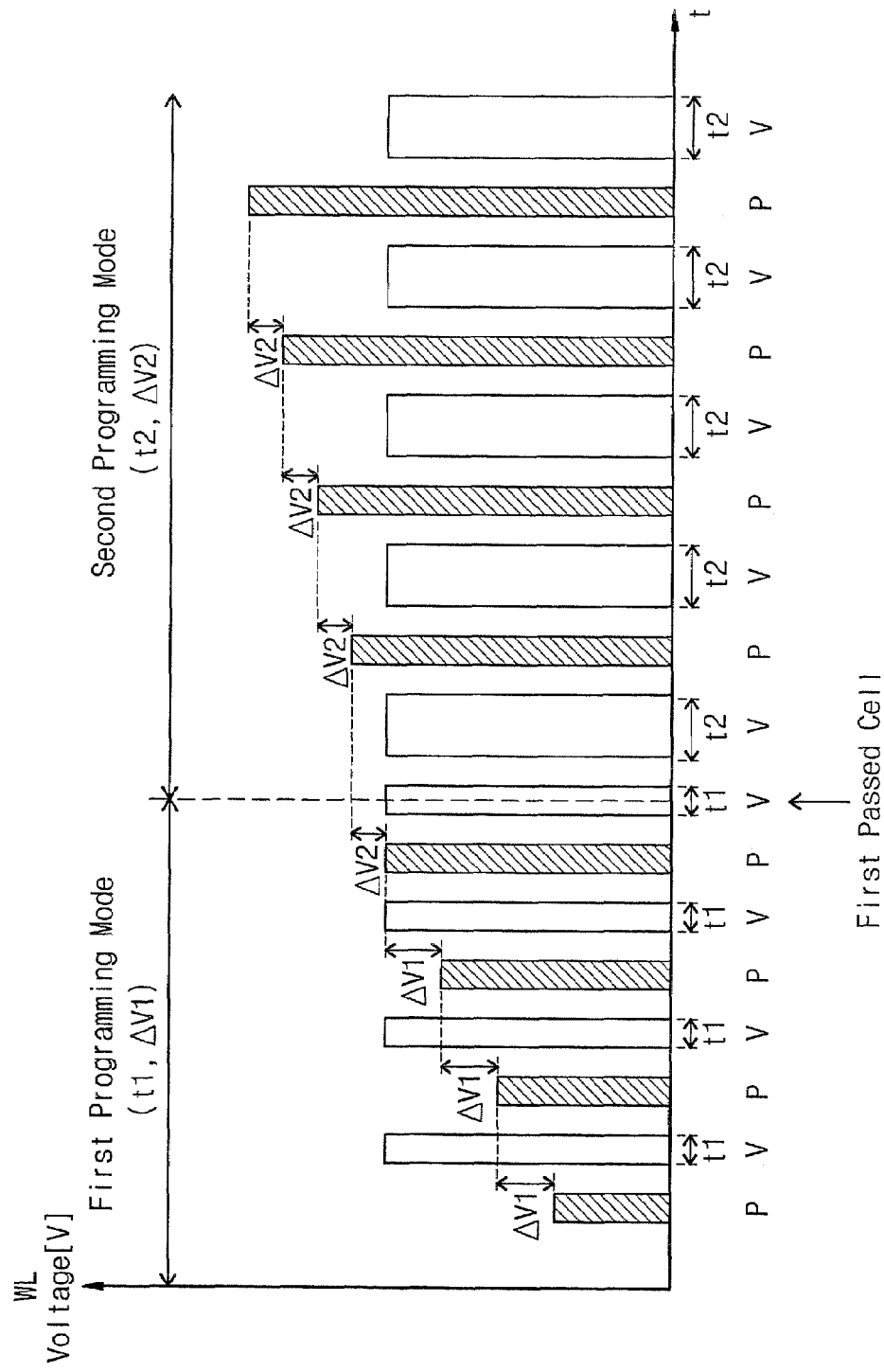
FIG. 7 is a diagram illustrating variations of wordline voltages versus time by an adaptive ISPP scheme in accordance with embodiments of the invention.

FIG. 7 is a diagram illustrating variations of wordline voltages versus time by the adaptive ISPP scheme in accordance with embodiments of the invention, showing stepping-up pulses of the program voltage and variable verifying times. In FIG. 7, the hatched portions denote the program voltage pulses and the others denote pulses of the verifying voltage. The first programming mode is the period where the program voltage pulse with the larger incremental step range ΔV1 and the verifying voltage pulse for the shorter verifying time t1 are alternately applied to the wordlines of the memory cells prior to the generation (or detection) of the first passed cell. After detecting at least the first passed cell, operations switch to the second programming mode in which the program voltage pulse with the smaller incremental step range ΔV2 and the verifying voltage pulse for the longer verifying time t2 are alternately applied to the wordlines of the memory cells. The turning point changing from the first programming mode to the second programming mode corresponds to the last verifying operation of the first programming mode, at which the first passed cell is detected at least, as noticed by the broken line shown in FIG. 7. Then, after the generation of the first passed cell, the second programming mode performs a first verifying operation with the verifying time t2 that is sufficiently longer than the verifying time t1 of the first programming mode. Thereafter, in the second programming mode, the programming and verifying loop is repeated using the program voltage pulses with the smaller incremental step range ΔV2 and the longer verifying time t2, until all of the memory cells are completely programmed.

Figure 8:
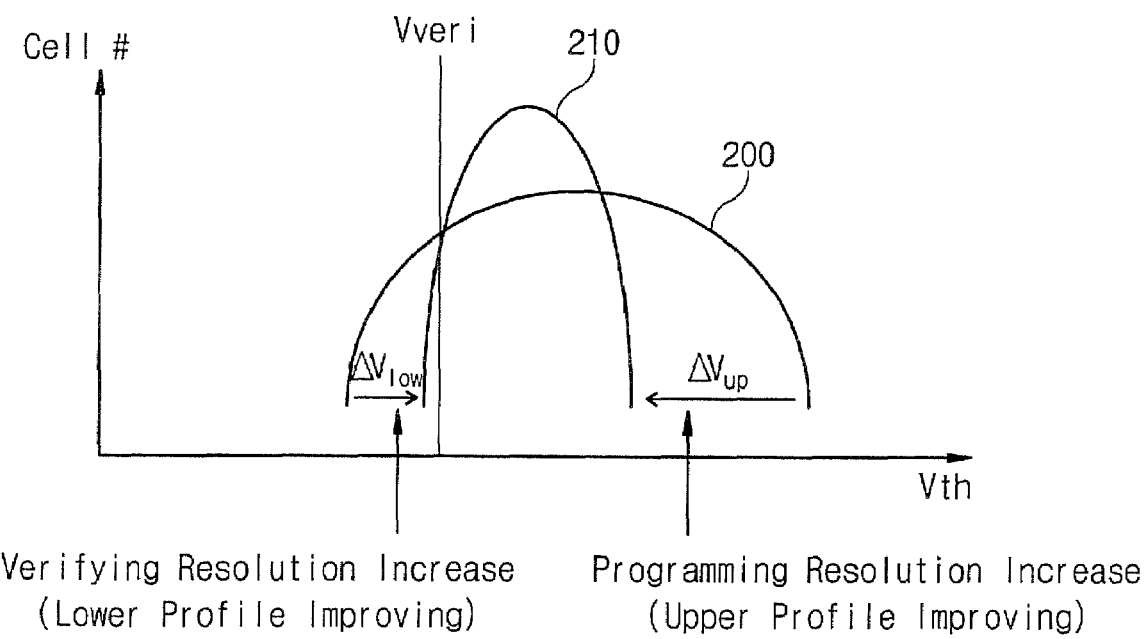
FIG. 8 is a diagram showing improved distribution profiles of threshold voltages by the programming scheme according to embodiments of the invention.

FIG. 8 graphically shows an improved distribution profile of threshold voltages by the programming scheme according to the invention, compared to the conventional one 200 with the present profile 210 by the adaptive ISPP scheme of the invention. From FIG. 8, it can be seen that the cell threshold-voltage distribution profile 210 by the invention is configured to be more tightly constrained in width compared with the conventional distribution profile 200.

The improvement on the lower side of the present distribution profile, $\Delta V_{low}$, results from the process of accurately detecting the cell states by re-verifying the passed cells for the extended verifying time (i.e., the longer verifying time t2), after the generation of the first passed cell. On the other hand, The improvement on the upper side of the present distribution profile, $\Delta V_{up}$, is obtained because the memory cells are restricted in the higher range of threshold voltage by conducting the high-resolution programming operation with the smaller incremental step range ΔV2 after the generation of the first passed cell.

With the aforementioned organizations and operating steps for programming and verifying, the cell threshold-voltage distribution profile after programming is remarkably improved relative to the conventional distribution profile. The invention may be applicable to other types of flash memory devices, besides the NOR-type flash memory device.

The programming operations performed by embodiments of the invention area able to restrain the upper and lower threshold-voltage distribution profiles that result from programming operations. Thus, embodiments of the invention may be used in memory devices that require narrow threshold-voltage characteristics, such as multi-level cells.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
   at least a first non-volatile memory device having at least a first array of nonvolatile memory cells therein, said first non-volatile memory device configured to program a row of non-volatile memory cells in the first array by repeatedly verifying the threshold voltages of a plurality of non-volatile memory cells in the row being programmed in parallel, using a plurality of memory verify operations that are interleaved in time relative to operations to increase threshold voltages of the plurality of non-volatile memory cells;
   wherein the plurality of memory verify operations include a first sequence of memory verify operations that are performed during corresponding first verify time intervals having equivalent durations; and
   wherein the first sequence of memory verify operations are followed by a second sequence of memory verify operations that are performed during corresponding second verify time intervals having equivalent durations greater than the durations of the first verify time intervals.

2. The device of claim 1, wherein said first non-volatile memory device is further configured to program the row of non-volatile memory cells in the first array by driving a word line associated with the row with a first stair step sequence of program voltages having a first step height and then driving the word line with a second stair step sequence of program voltages having a second step height less than the first step height; and wherein repeatedly verifying comprises repeatedly verifying the programmed threshold voltages of the plurality of non-volatile memory cells in the row relative to a verify voltage that remains unchanged during the repeatedly verifying.

3. The device of claim 1, wherein said control circuit comprises:
   a row decoder electrically coupled to a plurality of word lines in the first array;
   a voltage generator electrically coupled to said row decoder and responsive to a voltage control signal; and a program controller configured to switch the voltage control signal from a first logic state to a second logic state in response to a first pass signal.

4. The device of claim 3, wherein said program controller is further configured to switch the voltage control signal from the second logic state to the first logic state in response to a last pass signal.

5. The device of claim 4, wherein said control circuit further comprises a sense amplifier and a pass/fail detector electrically coupled to an output of the sense amplifier and configured to generate the first and last pass signals.

6. The device of claim 5, wherein the sense amplifier is responsive to a sense amplifier enable signal generated by said program controller.

7. The device of claim 5, wherein the pass/fail detector comprises a first pass detector having OR logic therein and a last pass detector having AND logic therein.

8. A method of programming a flash memory device, comprising:
programming a plurality of non-volatile memory cells in a row of the flash memory device during a first programming mode of operation containing a first interleaved sequence of programming and verify operations having respective first programming durations and first verify durations until at least a first passed memory cell is detected; and then
programming a plurality of non-volatile memory cells in a row of the flash memory device in a second programming mode of operation containing a second interleaved sequence of programming and verify operations having respective second programming durations and second verify durations;
wherein said operating the flash memory device in a second programming mode of operation commences with an operation to re-verify a programmed state of the first passed memory cell; and wherein the first verify durations are of equivalent length, the second verify durations are of equivalent length, and the second verify durations are longer than the first verify durations.

9. The method of claim 8, wherein the first programming mode of operation uses a first stair-step sequence of program voltages during the first interleaved sequence of programming and verify operations; wherein the second programming mode of operation uses a second stair-step sequence of program voltages during the second interleaved sequence of programming and verify operations; and wherein a step height associated with the first stair-step sequence of program voltages is different than a step height associated with the second stair-step sequence of program voltages.

10. The method of claim 9, wherein the step height associated with the first stair-step sequence of program voltages is greater than a step height associated with the second stair-step sequence of program voltages.

11. The method of claim 9, wherein the first programming mode of operation uses first verify voltages during the first interleaved sequence of programming and verify operations; wherein the second programming mode of operation uses second verify voltages during the second interleaved sequence of programming and verify operations; and wherein the first and second verify voltages are equivalent.

12. The method of claim 8, wherein the first programming mode of operation uses first verify voltages during the first interleaved sequence of programming and verify operations; wherein the second programming mode of operation uses second verify voltages during the second interleaved sequence of programming and verify operations; and wherein the first and second verify voltages are equivalent.

* * * * *